(12) United States Patent
Ma et al.

(10) Patent No.: US 9,167,716 B2
(45) Date of Patent: Oct. 20, 2015

(54) BLADE SERVER CHASSIS BAY DIVIDER

(71) Applicant: Dell Products, LP, Round Rock, TX (US)

(72) Inventors: Liang-Chun Ma, Taipei (TW); Kuo-Chih Lin, Taipei (TW); Chih Min Su, New Taipei (TW)

(73) Assignee: Dell Products, LP, Round Rock, TX (US)

( * ) Notice: Subject to any disclaimer, the term of this patent is extended or adjusted under 35 U.S.C. 154(b) by 93 days.

(21) Appl. No.: 14/105,864

(22) Filed: Dec. 13, 2013

(65) Prior Publication Data
US 2015/0173235 A1    Jun. 18, 2015

(51) Int. Cl.
G06F 1/16    (2006.01)
H05K 7/14    (2006.01)

(52) U.S. Cl.
CPC ............ H05K 7/1489 (2013.01); H05K 7/1487 (2013.01)

(58) Field of Classification Search
USPC ............... 710/104, 313, 316, 100; 455/556.1, 455/566, 466, 41.1, 456.1; 248/282.2, 917, 248/188, 284.1; 361/725, 679.41, 679.21, 361/679.27, 679.09, 679.01, 679.45, 361/679.06, 679.07, 679.58, 679.02, 361/679.47, 679.52, 679.33, 679.4, 679.54, 361/679.46, 679.53, 679.55, 679.48, 361/679.37, 679.38; 312/223.2, 222, 244, 312/334.46, 333, 271, 312, 211, 215
See application file for complete search history.

(56) References Cited

U.S. PATENT DOCUMENTS

| | | | |
|---|---|---|---|
| 7,940,521 B2 * | 5/2011 | Carlisi et al. | ............. 361/679.41 |
| 8,649,180 B2 * | 2/2014 | Grady et al. | .................. 361/725 |
| 8,984,191 B2 * | 3/2015 | Cox | .............................. 710/104 |
| 2007/0279858 A1 | 12/2007 | Grady et al. | |
| 2008/0239649 A1 | 10/2008 | Bradicich et al. | |
| 2008/0259555 A1 | 10/2008 | Bechtolsheim et al. | |
| 2008/0266813 A1 | 10/2008 | Carlisi et al. | |
| 2009/0016019 A1 | 1/2009 | Bandholz et al. | |
| 2009/0086456 A1 | 4/2009 | Milo et al. | |
| 2013/0141243 A1 | 6/2013 | Watts | |
| 2013/0155604 A1 | 6/2013 | Lin | |
| 2013/0258587 A1 | 10/2013 | Li et al. | |
| 2013/0286574 A1 | 10/2013 | Ganta Papa Rao Bala | |

\* cited by examiner

*Primary Examiner* — Hung Duong
(74) *Attorney, Agent, or Firm* — Larson Newman, LLP (57) ABSTRACT

A divider for a bay of a blade server chassis includes a plurality of posts, a plurality of flex tabs, and a rail. The posts are located along a first side of the divider, and are configured to be inserted within respective holes in a first panel of the bay of the blade server chassis. The flex tabs are located along a second side of the divider, and are placed in physical communication with a second panel of the bay. The flex tabs are configured compress within the divider and away from the second panel to enable the posts to be inserted within in the holes of the first panel, the second side of the divider being opposite to the first side of the divider. The rail is located along a third side of the divider, and is configured to guide a blade server within the bay.

20 Claims, 7 Drawing Sheets

BLADE SERVER CHASSIS BAY DIVIDER

FIELD OF THE DISCLOSURE

This disclosure generally relates to information handling systems, and more particularly relates to a blade server chassis bay divider.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A blade server chassis of an information handling system, such as a blade server, can include multiple bays, and each bay can be configured to hold either a single full-height blade server or two half-height blade servers. A user can order the blade server chassis set up in a number of different configurations. For example, if the blade server chassis has two bays the user can order the blade server chassis in three different configurations, such as two full-height blades, one full-height blade and two half-height blades, and four half-height servers.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
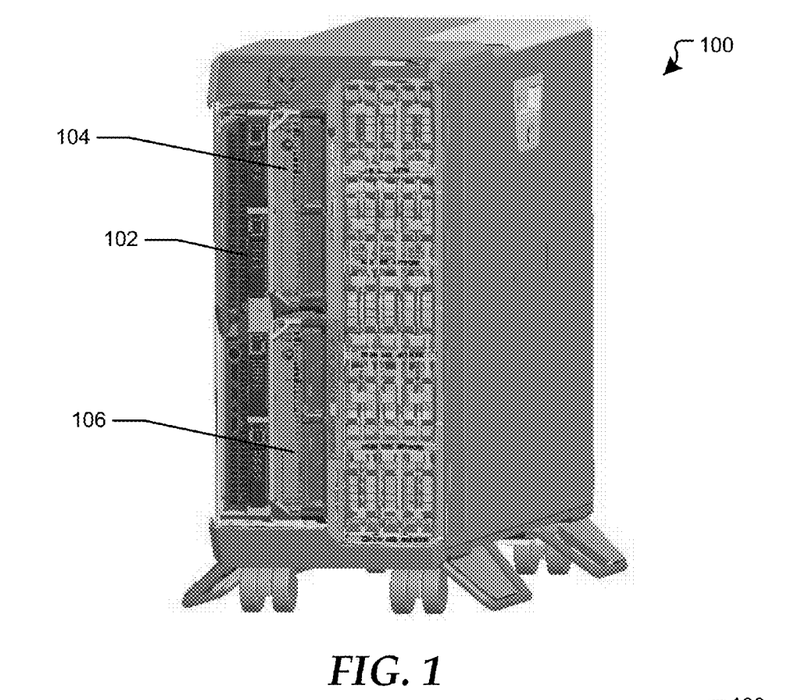
FIGS. 1-3 are diagrams showing different views of a blade server chassis.
Figure 2:
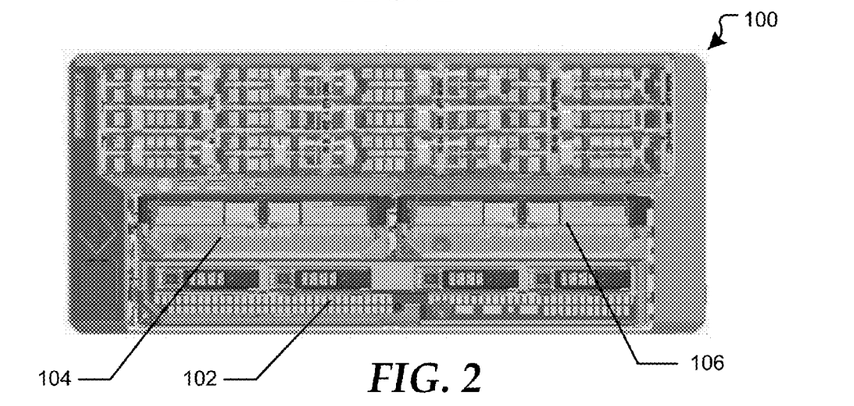
Figure 3:
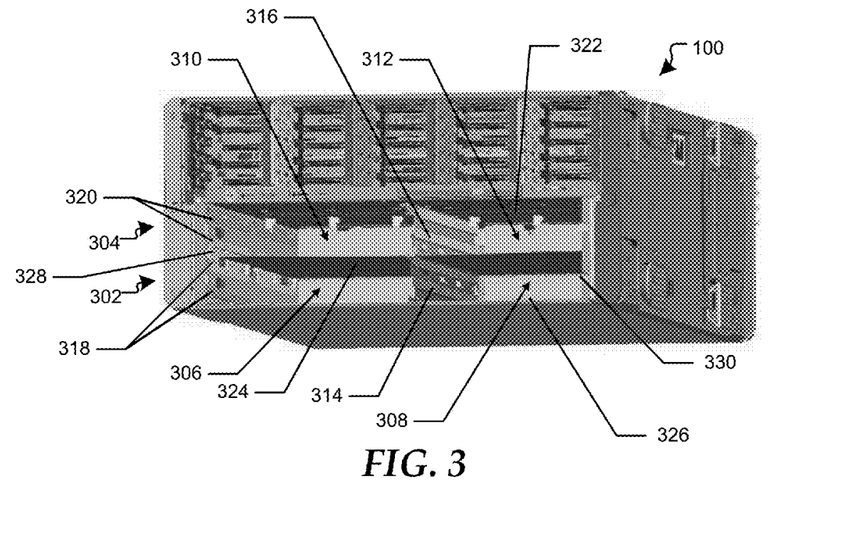

FIGS. 1-3 illustrate a blade server chassis 100 to hold one or more information handling systems, such as blade servers 102, 104, and 106. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The blade server chassis 100 can operate in either a vertical orientation, shown in FIG. 1, or a horizontal orientation, shown in FIG. 2. Referring to FIG. 3, the blade server chassis 100 includes two full height bays 302 and 304, which can be divided into four half height bays 306, 308, 310, and 312 in response to dividers 314 and 316 being placed within the respective full height bays 302 and 304. The full height bay 302 includes rails 318, and the full height bay 304 includes rails 320. The blade server chassis also includes panels 322, 324, 326, 328, and 330. The blade server chassis 100 can be configured to hold different combinations of the blade servers 102, 104, and 106. For example, the blade server chassis 100 can hold one full-height blade server, such as blade server 102, that can fill an entire full height bay of the blade server chassis 100, such as bay 302 of FIG. 3. The blade server chassis 100 can also hold two half-height blade servers, such as blade servers 104 and 106, that can each fill a half-height bay of the blade server chassis 100, such as bays 310 and 312 of FIG. 3.

When the divider 314 is not located with the bay 302 and the blade server chassis 100 is in the vertical orientation, as shown in FIG. 1, the blade server 102 can be guided into and held in placed within the blade server chassis by rails 118 of the bay 302. In this orientation, the blade server 102 can be suspended against gravity by one edge of the blade server being engaged with the rails 318, and the other edge of the blade server can rest on a flat surface of panel 330. When the divider 316 is not located with the bay 304 and the blade server chassis 100 is in the vertical orientation, the blade server 104 can be aligned and held in placed within the blade server chassis via rails 320 of bay 310. In this orientation, the blade server 104 can be suspended against gravity by one edge of the blade server being engaged with the rails 320. Additionally, the blade server 106 can be aligned and held in placed within the bay 312 of the blade server chassis 100 by an edge of the blade server resting against the flat surface of panel 330.

When the blade server chassis 100 is in the horizontal orientation and a user wants to place a number of half-height blade servers within the bays 306, 308, 310, and 312 of the blade server chassis, the dividers 314 and 316 are preferably placed with the bays 302 and 304. Otherwise, if the dividers 314 and 316 are not located with bays 302 and 304, the half-height blade servers placed in bays 308 and 312 the user may not be able to properly align the half-height blade servers within the bays 308 and 312 without rails to engage the half-height blade server to provide proper alignment. Thus, the dividers 314 and 316 can include rails similar to the rails 318 and 320 to provide proper alignment of half-height servers within bays 308 and 312.

Each divider 314 and 316 can be a removable support that can be added to either of the bays 302 and 304 to change the configuration of the bay from being able to hold a single full-height blade server to being able to hold two half-height blade servers. In an embodiment, the dividers 314 and 316 can be inserted into and removed from the bay without the user having to utilize any tools. Thus, the user can easily utilize the dividers 314 and 316 to change the configuration of the blade server chassis 100 after the purchase of the blade server chassis. In different configurations of the blade server chassis 100, the bays 302 and 304 may not have either divider 314 or divider 316, the bay 302 may include the divider 314 while the bay 304 does not include the divider 316, the bay 304 may include the divider 315 while the bay 302 does not include the divider 314, or bay 302 can include the divider 314 and bay 403 can include divider 316. Thus, the different configurations of the blade server chassis can include two full-height blade servers, one full-height blade server and two half-height blade servers, or four half-height blade servers.

Figure 4:
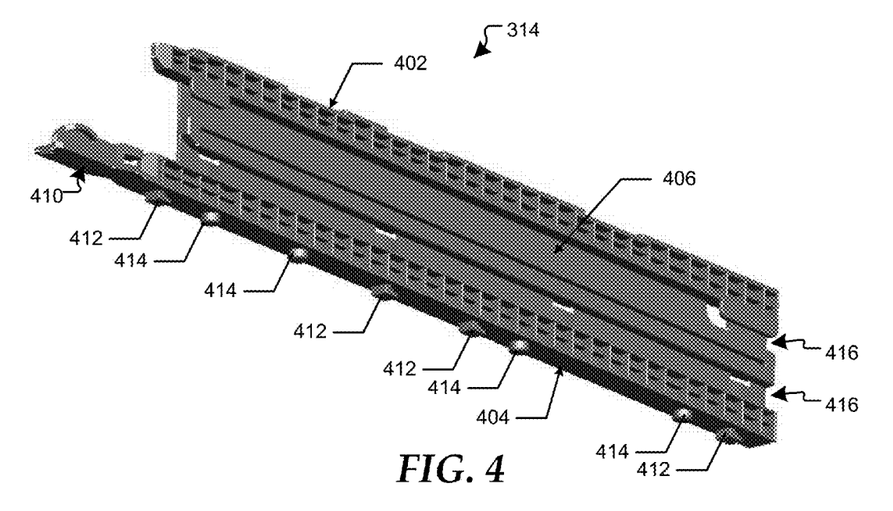
FIGS. 4 and 5 show different perspective views of a first divider for the blade server chassis.
Figure 5:
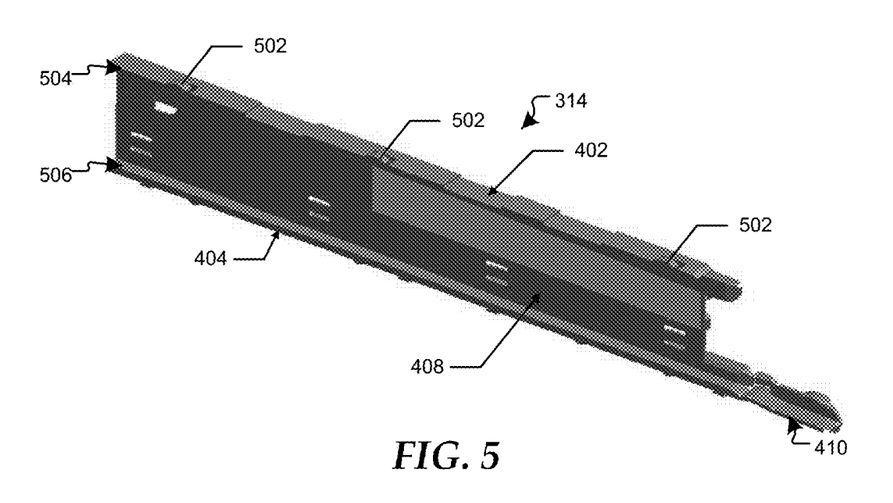

FIGS. 4 and 5 show different perspective views of the divider 314. The divider 314 includes first, second, third, and fourth sides 402, 404, 406, and 408, a spring arm 410, hook portions 412, posts 414, rails 416, flex tabs 502, and bars 504 and 506. The spring arm 410 extends from the first side 402 of the divider 314. The hooks 412 and the posts 414 are located along the second side 404 of the divider 314, and the flex tabs 502 are located along the first side 402 of the divider 316. The rails 416 extend the length of the third side 406. In an embodiment, the bar 504 is a portion of the first side 402 that extends away from the fourth side 408, and the bar 506 is a portion of the second side 404 that extends away from the fourth side 408.

When the divider 314 is inserted into the bay 302 and is rotated into a perpendicular orientation between panels 324 and 326 of the blade server chassis 100, the flex tabs 502 are placed in physical communication with a bottom surface of panel 324. The flex tabs 502 are configured to compress down within the first side 402 of the divider 314 while the divider is being rotated within the bay 302 of the blade server chassis 100. The compression of the flex tabs 502 can enable the hooks 412 and posts 414 along the second side 404 of the divider 314 to be inserted in holes 1002 of the panel 326. When the divider 314 is in the perpendicular orientation within the bay 302, the flex tabs 502 can extended away from the first side 402 of the divider 314 and be inserted within a first plurality of holes in the panel 324 of the blade server chassis 100. The divider 314 can then be pushed back into the bay 302, so that the hooks 412 can engage with the panel 326. In particular, the hooks 412 along the second side 402 can engage with holes of the panel 326 to hold the divider 314 within the bay 302 of the blade server chassis 100.

The user can then insert half-height blade servers into the bays 306 and 308 formed by the divider 314 splitting the full bay 302 in half. When a half-height blade server is inserted into the bay 308, the rails 616 can be used to align and support the blade server within the bay 308. Additionally, when a blade server is inserted into bay 306, the bars 504 and 506 can help guide the blade server within the bay. The bars 504 and 506 can also provide structural support to a blade server that has been installed within the bay 306.

Figure 6:
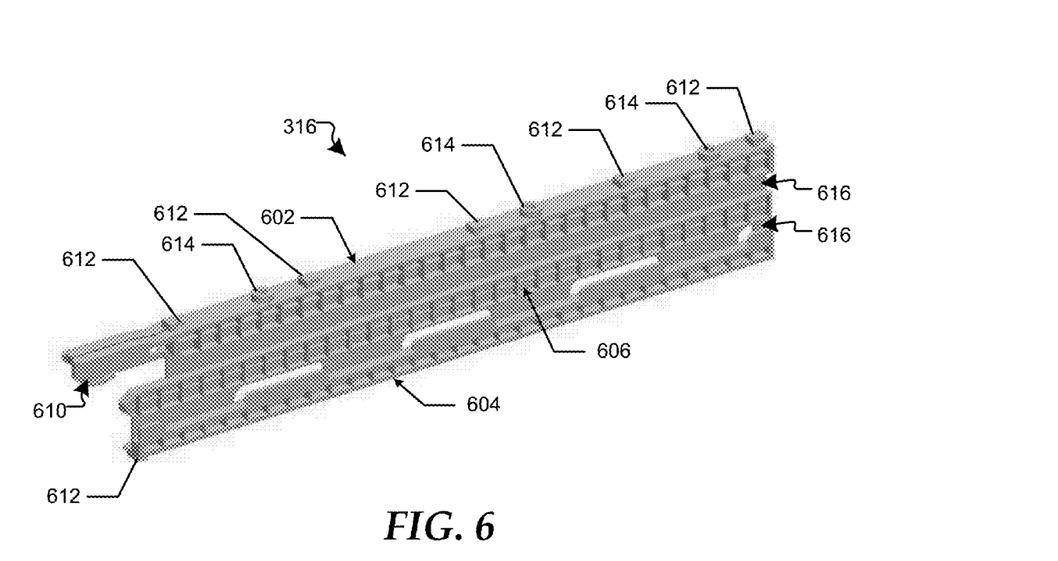
FIGS. 6 and 7 show different perspective views of a second divider for the blade server chassis.
Figure 7:
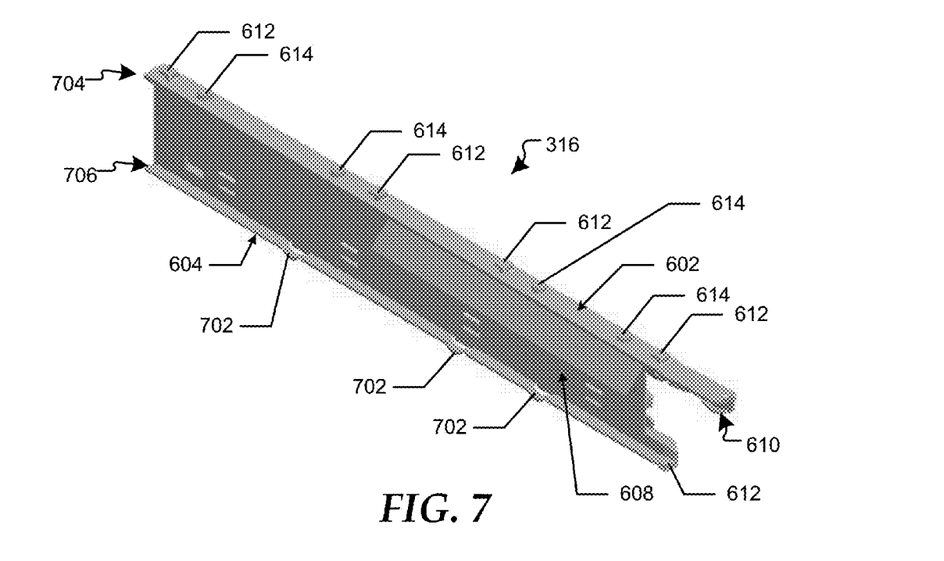

FIGS. 6 and 7 show different perspective views of the divider 316. The divider 316 includes first, second, third, and fourth sides 602, 604, 606, and 608, a spring arm 610, hook portions 612, posts 614, rails 616, flex tabs 702, and bars 704 and 706. The spring arm 610 extends from the first side 602 of the divider 316. One of the hook portions 612 is located at a front end of the second side 604 of the divider 316. The remainder of the hooks 612 and all of the posts 614 are located along the first side 602 of the divider 316, and the flex tabs 702 are located along the second side 604 of the divider 316. The rails 616 extend the length of the third side 606. In an embodiment, the bar 704 is a portion of the first side 602 that extends away from the fourth side 608, and the bar 706 is a portion of the second side 604 that extends away from the fourth side 608.

When the divider 316 is inserted into the bay 304 and is rotated into a perpendicular orientation between panels 322 and 324 of the blade server chassis 100, the flex tabs 702 are placed in physical communication with a top surface of panel 324. The flex tabs 702 are configured to compress up within the second side 604 of the divider 316 while the divider is being rotated within the bay 304 of the blade server chassis 100. The compression of the flex tabs 702 can enable the hooks 612 and posts 614 along the first side 602 of the divider 316 to be inserted in respective holes 1002, shown in FIG. 10, of the panel 322. When the divider 316 in the perpendicular orientation within the bay 304, the flex tabs 502 can extended away from the second side 604 of the divider 316 and be inserted within a second plurality of holes in the panel 324 of the blade server chassis 100. In an embodiment, the first and second pluralities of holes in the panel 324 are different holes to enable separate portions of dividers 314 and 316 to be inserted with the holes. The divider 316 can then be pushed back into the bay 304, so that the hooks 612 can engage with the panels 322 and 324. In particular, the hooks 612 along the first side 602 can engage with holes 1002, shown in FIG. 10, of the panel 322, and the hook at the front edge of the second side 604 can engage with the front of panel 324 to hold the divider 316 within the bay 304 of the blade server chassis 100.

The user can then insert half-height blade servers, such as blade servers 104 and 106, into the bays 310 and 312 formed by the divider 316 splitting the full bay 304 in half. When a half-height blade server, such as blade server 106 is inserted into the bay 312, the rails 616 can be used to align and support the blade server within the bay 312. Additionally, when a blade server, such as blade server 104, is inserted into bay 310, the bars 704 and 706 can help guide the blade server within the bay. The bars 704 and 706 can also provide structural support to a blade server that has been installed within the bay 310.

Figure 8:
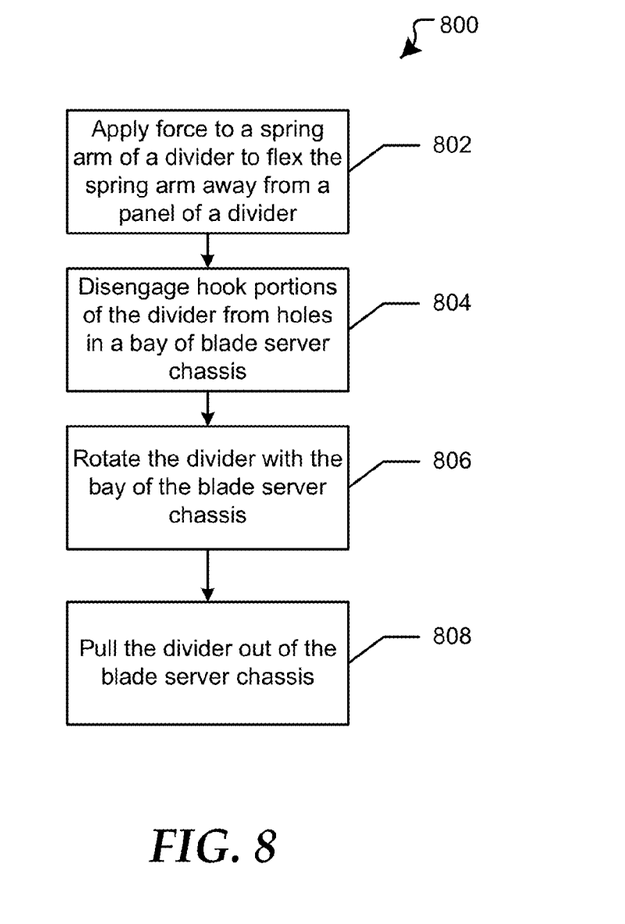
FIG. 8 is a flow diagram of a method for removing the second divider from the blade server chassis.
Figure 9:
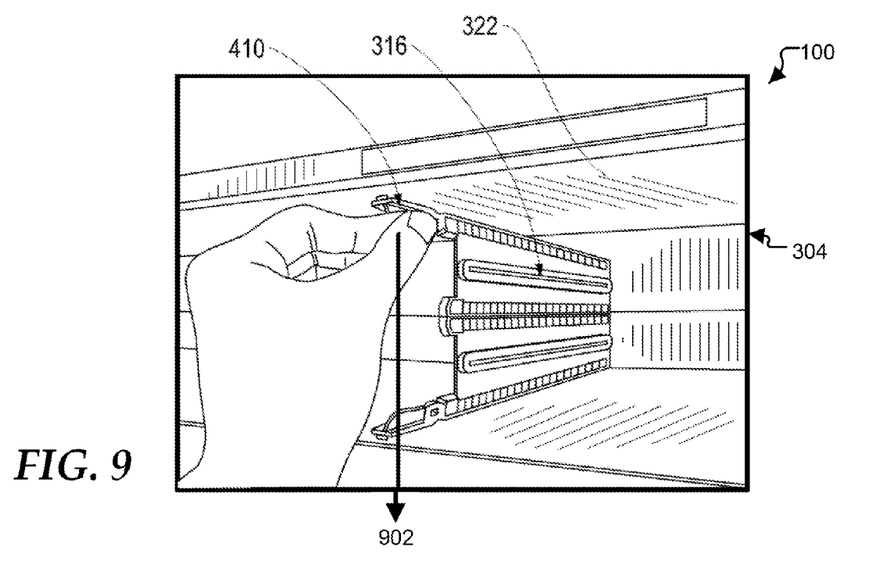
FIGS. 9-11 are diagrams showing different steps in method of removing the second divider from the blade server chassis.

FIG. 8 shows a flow diagram of a method 800 for removing the divider 316 from the blade server chassis 100. The method 800 will also be described with respect to the embodiment of the blade server chassis 100 shown in FIGS. 9-11. At block 802, a force is applied to the spring arm 610 of the divider 316 to cause the spring arm to flex away from the first side 602 of the divider. The force can be applied in the direction of arrow 902, shown in FIG. 9, to pull the spring arm 610 down from the panel 316 and away from the top of the first side 602. At block 804, the hook portions 612 are disengaged from holes within the panel 322 and from the front of the panel 322, as shown in FIG. 9.

Figure 10:
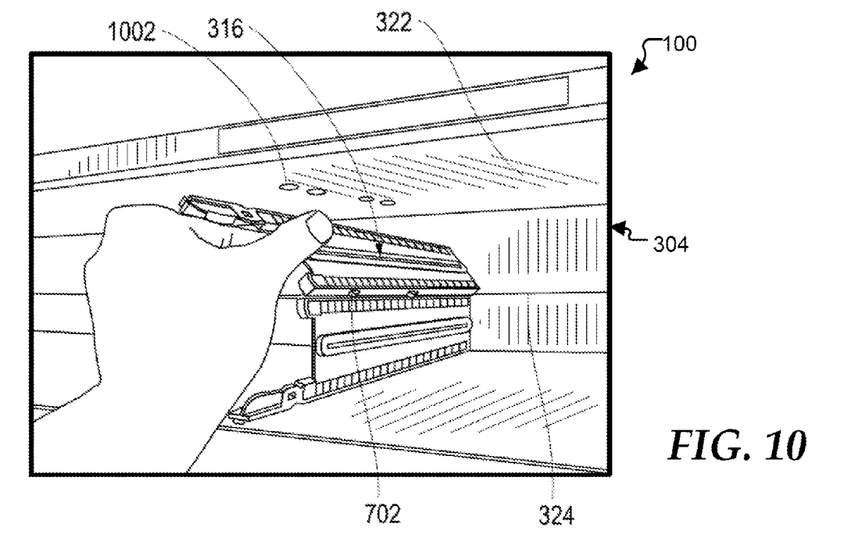
Figure 11:
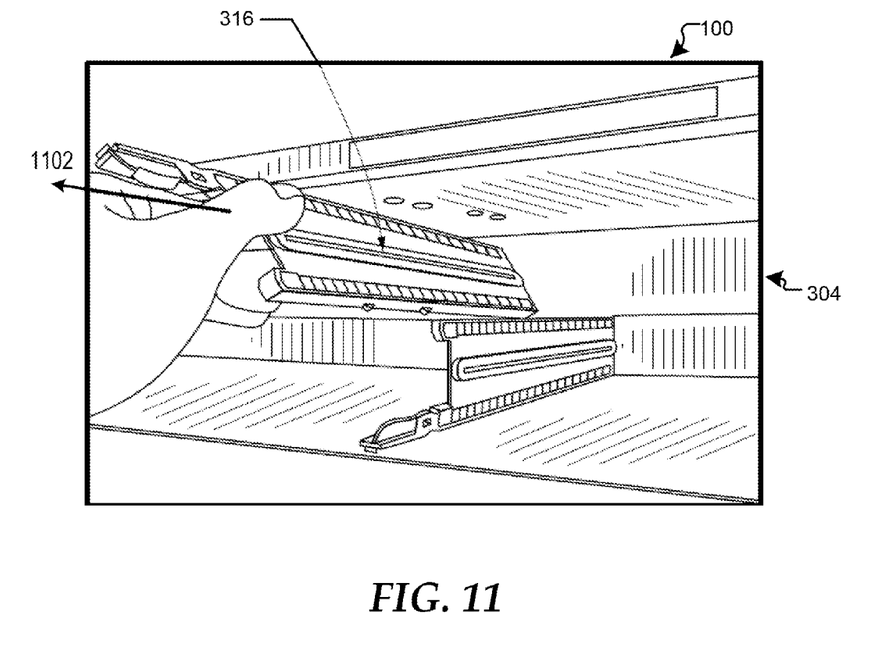

At block 806, the divider 316 is rotated within the bay 304, as shown in FIG. 10. When the divider 316 is rotated within the bay 304, the hooks 612 and the posts 614 are no longer within the holes 1002 and the flex tabs 502 have been removed from holes in the panel 324 of the blade server chassis 100. At block 808, the divider 316 is pulled out of the bay 304 in the direction of arrow 1102 of FIG. 11. When the divider 316 is completely removed from the bay 304, the bay can then be utilized to hold a full-height blade server.

If the dividers 314 and 316 were not included in the blade server chassis 100, the blade server chassis would have to be built to include a permanent support in the middle of the bays 302 and 304 to support the half-height blade servers. In this situation, a user would not be able to change the configuration of the bays to allow a full-height blade server to be inserted within the bay that was built with a permanent support in the middle of the bay. Thus, the dividers 314 and 316 can enable a user to easily change the configuration/chassis orientation of the blade server chassis 100 after purchase in multiple different ways to support different sizes and numbers of blade servers.

Although only a few exemplary embodiments have been described in detail in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A divider for a bay of a blade server chassis, the divider comprising:
   a plurality of posts located along a first side of the divider, the posts configured to be inserted within respective holes in a first panel of the bay of the blade server chassis;
   a plurality of flex tabs located along a second side of the divider, the flex tabs to be placed in physical communication with a second panel of the bay and to compress within the divider and away from the second panel to enable the posts to be inserted within in the holes of the first panel, the second side of the divider being opposite to the first side of the divider; and
   a rail located along a third side of the divider, wherein the rail is configured to guide a blade server within the bay.

2. The divider of claim 1 further comprising:
   a bar extending from the first side and away from the second side of the divider, the bar to provide structural support for another blade server when installed within the bay.

3. The divider of claim 1 further comprises:
   a hook portion connected to a front of the second side of the divider, the hook portion configured engage with a front of the first panel.

4. The divider of claim 3 further comprises:
   a spring arm extending from the first side of the divider, the spring arm configured to flex away from the first side in response to a force applied to the spring arm, wherein the posts are configured to be removed from the holes in response to the force applied to the spring arm.

5. The divider of claim 4 wherein the hook is configured to be removed from the first panel of the bay in response to the force being applied to the spring arm.

6. The divider of claim 4 wherein the divider is capable of being removed from the bay in response to the hook being removed from the front of the first panel.

7. The divider of claim 4 wherein the divider is configured to enable two half-height blade servers to be securely held within the bay while the blade server chassis is in a horizontal orientation.

8. A blade server chassis comprising:
   a bay including first and second panels; and
   a divider in physical communication with the first and second panels of the bay, the divider including:
      a plurality of posts located along a first side of the divider, the posts configured to be inserted within respective holes in a first panel of the bay of the blade server chassis;
      a plurality of flex tabs located along a second side of the divider, the flex tabs to be placed in physical communication with a second panel of the bay and to compress within the divider and away from the second panel to enable the posts to be inserted within in the holes of the first panel, the second side of the divider being opposite to the first side of the divider; and
      a rail located along a third side of the divider, wherein the rail is configured to guide a blade server within the bay.

9. The blade server chassis of claim 8 further comprising:
   a bar extending from the first side and away from the second side of the divider, the bar to provide structural support for another blade server when installed within the bay.

10. The blade server chassis of claim 8 wherein the divider further comprises:
    a hook portion connected to a front of the second side of the divider, the hook portion configured engage with a front of the first panel.

11. The blade server chassis of claim 10 wherein the divider further comprises:
    a spring arm extending from the first side of the divider, the spring arm configured to flex away from the first side in response to a force applied to the spring arm, wherein the posts are configured to be removed from the holes in response to the force applied to the spring arm.

12. The blade server chassis of claim 11 wherein the hook is configured to be removed from the first panel of the bay in response to the force being applied to the spring arm.

13. The blade server chassis of claim 11 wherein the divider is capable of being removed from the bay in response to the hook being removed from the front of the first panel.

14. The blade server chassis of claim 8 wherein the blade server is a half-height blade server, and wherein the divider enables the blade server to be securely held within the bay while the blade server chassis is in a horizontal orientation.

15. A blade server chassis comprising:
    a bay including first and second panels;
    a blade server configured to be held within the bay; and
    a divider in physical communication with the first and second panels of the bay, the divider including:
       a plurality of posts located along a first side of the divider, the posts configured to be inserted within respective holes in a first panel of the bay of the blade server chassis;
       a plurality of flex tabs located along a second side of the divider, the flex tabs to be placed in physical communication with a second panel of the bay and to compress within the divider and away from the second panel to enable the posts to be inserted within in the holes of the first panel, the second side of the divider being opposite to the first side of the divider; and a rail located along a third side of the divider, wherein the rail is configured to guide the blade server within the bay.

16. The blade server chassis of claim 15 wherein the divider further comprises:

a bar extending from the first side and away from the second side of the divider, the bar to provide structural support for another blade server when installed within the bay.

17. The blade server chassis of claim 15 wherein the divider further comprises:

a hook portion connected to a front of the second side of the divider, the hook portion configured engage with a front of the first panel.

18. The blade server chassis of claim 17 wherein the divider further comprises:

a spring arm extending from the first side of the divider, the spring arm configured to flex away from the first side in response to a force applied to the spring arm, wherein the posts are configured to be removed from the holes in response to the force applied to the spring arm 19. The blade server chassis of claim 18 wherein the hook is configured to be removed from the first panel of the bay in response to the force being applied to the spring arm.

20. The blade server chassis of claim 15 wherein the blade server is a half-height blade server, and wherein the divider enables the blade server to be securely held within the bay while the blade server chassis is in a horizontal orientation.

\* \* \* \* \*